United States Patent
Hsu et al.

(10) Patent No.: US 8,057,242 B2
(45) Date of Patent: Nov. 15, 2011

(54) BURN-IN SOCKET ASSEMBLY WITH BASE HAVING PROTRUDING STRIPS

(75) Inventors: Hsiu-Yuan Hsu, Tu-Cheng (TW); Ke-Hao Chen, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/854,185

(22) Filed: Aug. 11, 2010

(65) Prior Publication Data
US 2011/0039425 A1 Feb. 17, 2011

(30) Foreign Application Priority Data
Aug. 11, 2009 (TW) ................ 98214742 U

(51) Int. Cl.
*H01R 12/00* (2006.01)
(52) U.S. Cl. .......................................... 439/73
(58) Field of Classification Search .............. 439/73, 439/331
See application file for complete search history.

(56) References Cited

U.S. PATENT DOCUMENTS

| | | | | |
|---|---|---|---|---|
| 5,387,120 A * | 2/1995 | Marks et al. | ................. | 439/331 |
| 5,528,466 A * | 6/1996 | Lim et al. | ................. | 361/820 |
| 5,609,497 A * | 3/1997 | Kawabe | ................. | 439/331 |
| 6,716,049 B1 * | 4/2004 | Gattuso et al. | ................. | 439/331 |
| 7,030,638 B2 * | 4/2006 | Stutzman | ................. | 324/756.02 |
| 7,121,845 B2 * | 10/2006 | Liao et al. | ................. | 439/73 |
| 7,335,030 B2 * | 2/2008 | Kunioka et al. | ................. | 439/73 |
| 7,462,057 B2 * | 12/2008 | Hsu | ................. | 439/331 |
| 7,548,422 B2 * | 6/2009 | Hsieh | ................. | 361/695 |
| 7,666,022 B2 * | 2/2010 | Yeh et al. | ................. | 439/331 |
| 7,666,029 B2 * | 2/2010 | Lin | ................. | 439/526 |
| 7,828,576 B2 * | 11/2010 | Lin et al. | ................. | 439/331 |
| 7,833,021 B2 * | 11/2010 | Lin | ................. | 439/68 |
| 7,862,363 B2 * | 1/2011 | Chen et al. | ................. | 439/331 |
| 2006/0040524 A1 * | 2/2006 | Liao et al. | ................. | 439/73 |
| 2007/0010107 A1 * | 1/2007 | Wright et al. | ................. | 439/73 |
| 2007/0238327 A1 * | 10/2007 | Hsu | ................. | 439/70 |
| 2007/0259543 A1 * | 11/2007 | Hsieh | ................. | 439/73 |
| 2008/0076272 A1 * | 3/2008 | Hsu | ................. | 439/55 |
| 2009/0253276 A1 * | 10/2009 | Lin | ................. | 439/68 |
| 2009/0317988 A1 | 12/2009 | Lin | | |

* cited by examiner

Primary Examiner — Tulsidas C Patel
Assistant Examiner — Vladimir Imas
(74) Attorney, Agent, or Firm — Andrew C. Cheng; Wei Te Chung; Ming Chieh Chang

(57) ABSTRACT

A burn-in socket assembly comprises a base, a loading member and a plurality of contacts. The base has a bottom wall, a plurality of sidewalls and a cavity surrounded by the bottom wall and the sidewalls, the bottom wall defines a plurality of contact receiving holes. The loading member is assembled within the base for loading an integrated circuit package and defines a plurality of passageways corresponding to the contact receiving holes of the base. The contacts are received in the contact receiving holes of the base and the passageways of the loading member. The bottom wall is further formed with a plurality of protruding strips on a top surface thereof and between two adjacent rows of the contact receiving holes to support the loading member.

18 Claims, 8 Drawing Sheets

BURN-IN SOCKET ASSEMBLY WITH BASE HAVING PROTRUDING STRIPS

FIELD OF THE INVENTION

The present invention relates to a burn-in socket assembly, and particularly to a socket assembly in which a base has a plurality of protruding strips for supporting a loading member on which an IC package is loaded.

DESCRIPTION OF RELATED ART

Burn-in socket assembly is an indispensable equipment for ensuring proper function of an IC package before it is delivered. US Patent Application Publication No. 2009-0317988 discloses such a burn-in socket adapted for connecting an integrated circuit (IC) package and a printed circuit board. The burn-in socket comprises a base having a rectangular configuration, a plurality of contacts received in the base, a loading member assembled within the base and a lid assembled on the base and movable with respect to the base. The base has a bottom wall, a plurality of sidewalls upwardly extending from a peripheral of the bottom wall and a receiving cavity surrounded by the bottom wall and the sidewalls.

When testing the IC package, the IC package is loaded on the loading member and then downwardly pressed, however, the bottom wall of the base is not provided with any supporters which may be used to support the loading member and the IC package, so a center part of the loading member may bow down after the burn-in socket is used for an extended period of time, that may cause that the contacts fail to reliably and properly in touch with the IC package, and may influence the electrical connection between the connector and the IC package.

Hence, an improved burn-in socket assembly is required to overcome the above-mentioned disadvantages of the related art.

SUMMARY OF THE INVENTION

An object of the present invention is to provide a burn-in socket assembly with a base and a loading member for loading an integrated circuit (IC) package, and the base can reliably support the loading member.

To achieve the aforementioned object, a burn-in socket assembly, comprises a plurality of contacts, a base and a loading member received within the base for loading the IC package. The base has a bottom wall which defines a plurality of contact receiving holes receiving the contacts. The bottom wall of the base is formed with a plurality of protruding strips between two rows of the contact receiving holes to support the loading member.

Other objects, advantages and novel features of the invention will become more apparent from the following detailed description of a preferred embodiment when taken in conjunction with the accompanying drawings.

DETAILED DESCRIPTION OF THE INVENTION

Figure 1:
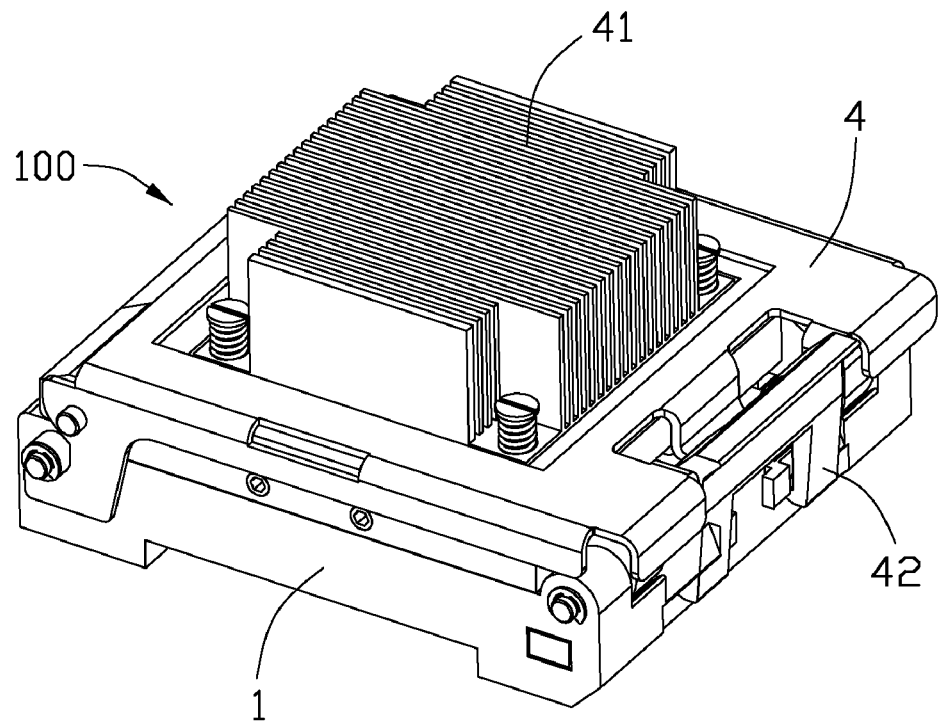
FIG. 1 is an assembled, perspective view of a burn-in socket assembly in accordance with present invention.
Figure 2:
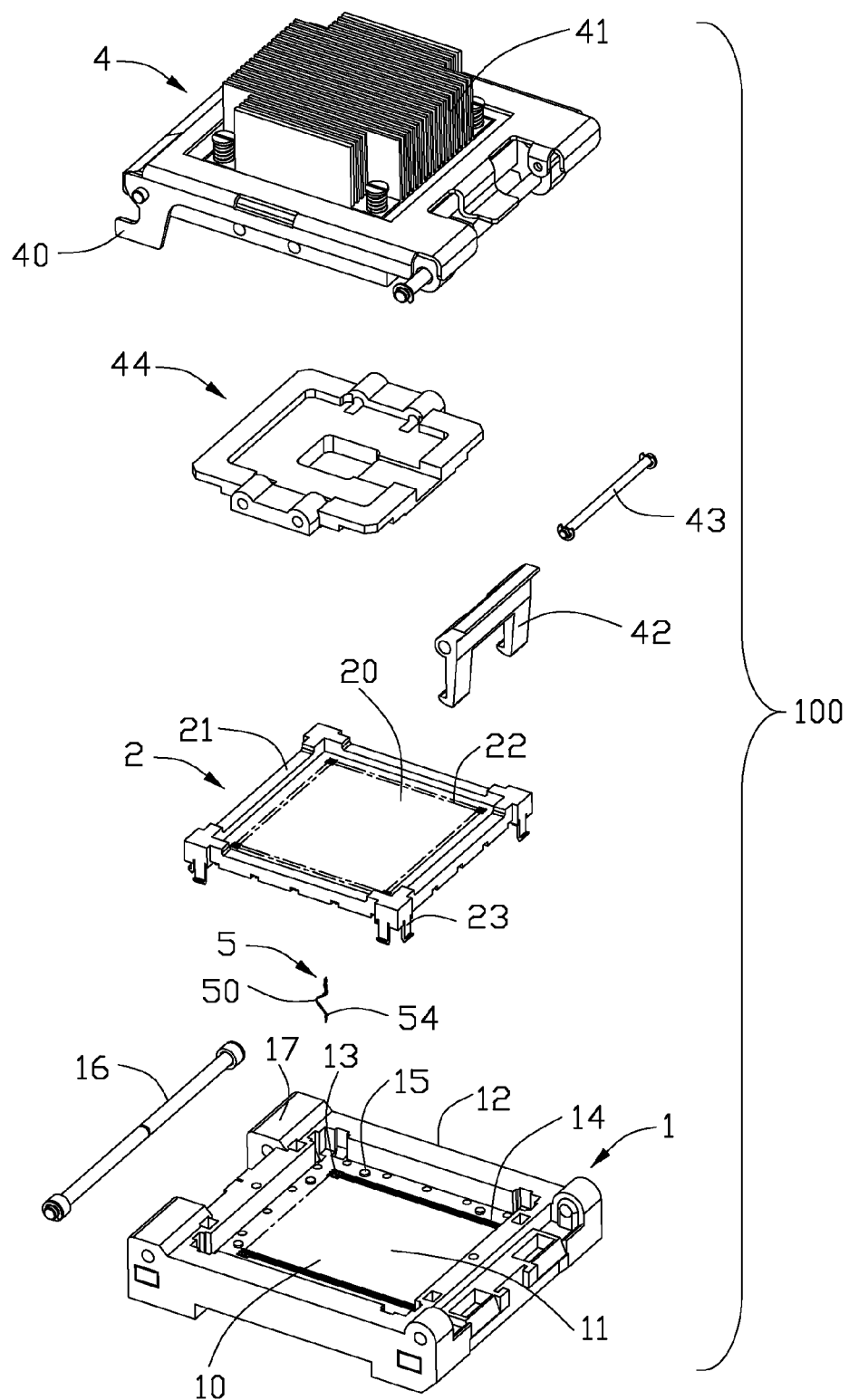
FIG. 2 is an exploded, perspective view of the burn-in socket assembly in accordance with present invention.
Figure 6:
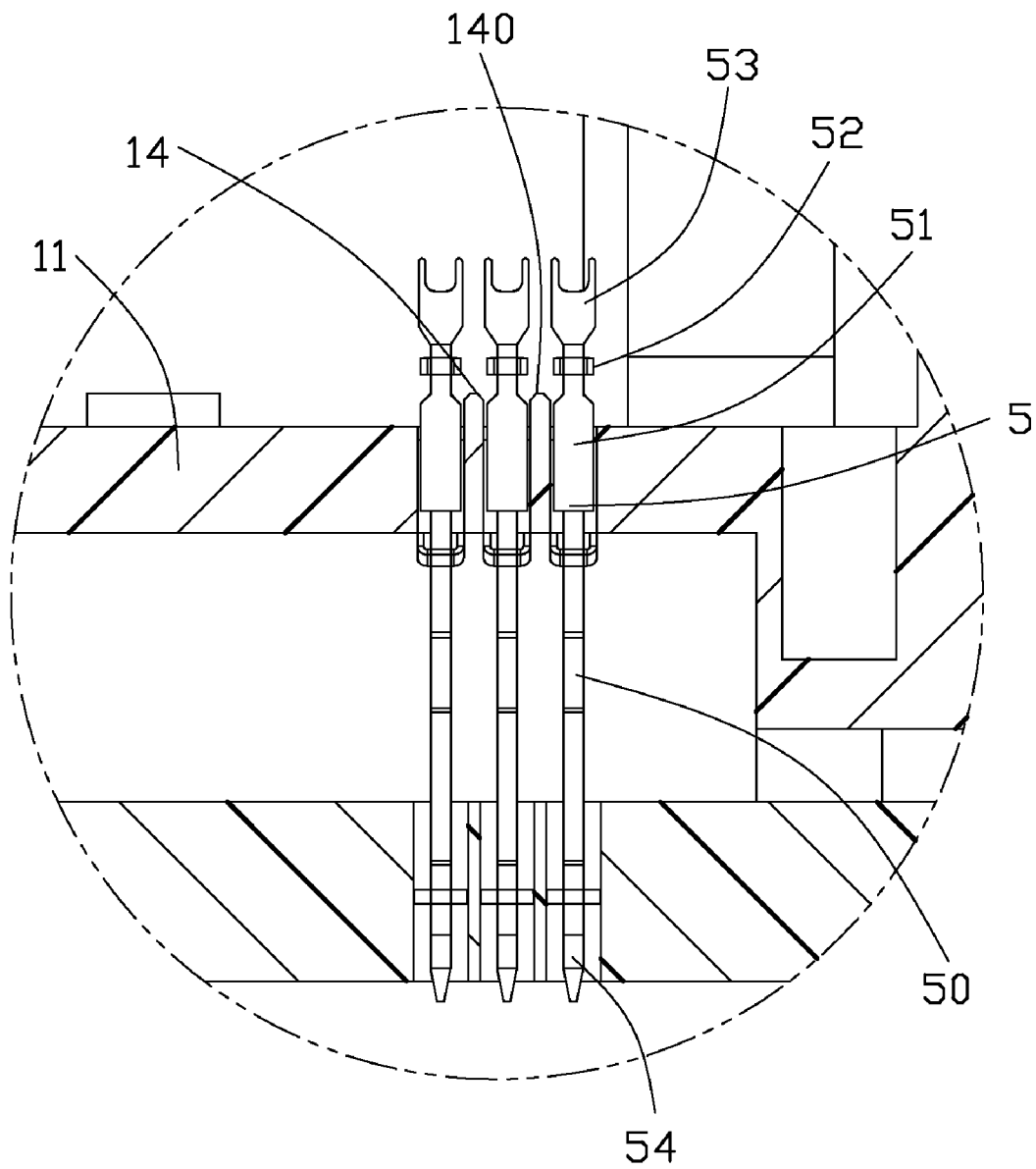
FIG. 6 is an enlarged view of the circled part in FIG. 5.

Referring to FIGS. 1-2 and 6, a burn-in socket assembly 100 in accordance with the present invention is disclosed. The burn-in socket assembly 100 is assembled on a testing circuit board (not shown) for receiving an integrated circuit (IC) package 6, and comprises a base 1, a plurality of contacts 5 received in the base 1, a loading member 2 assembled within the base 1 and a lid 4 pivotally assembled to the base 1.

Referring to FIG. 2, the base 1 has a rectangular configuration and has a bottom wall 11, a plurality of sidewalls 12 upwardly extending from a peripheral of the bottom wall 11 and a rectangular cavity 10 surrounded by the bottom wall 11 and the sidewalls 12. The base 1 defines a plurality of contact receiving holes 13 on the bottom wall 11 under the cavity 10. The plurality of protruding strips 14 are formed on a top surface of the bottom wall 11 and disposed between two adjacent rows of the contact receiving holes 13. The protruding strip 14 has two chamfers 140 on two opposite sides at a top end thereof. The bottom wall 11 of the base 1 has a plurality of bumps 15 on four corners. Two clumps 17 are disposed on two opposite sides of an end of the base 1, and a pivoting hole (not labeled) is formed on an inner surface of the clump 17 and passes through the clump 17 for receiving a shaft 16.

The loading member 2 is received on the bottom of the cavity 10 of the base 1 for loading the IC package 6 (referring to FIG. 7), and comprises a bottom plate 20 and a plurality of rims 21 upwardly protruding from a peripheral of the bottom plate 20, the bottom plate 20 has a plurality of passageways 22 corresponding to the contact receiving holes 13 of the base 1. The loading member 2 further has a plurality of latching arms 23 downwardly extending from an outer side of four corners thereof.

The contact 5 is stamped from a metal piece and has an elastic portion 50 with a transversal v-shaped configuration, a keeping portion 51 upwardly and upright extending from the elastic portion 50, a pair of blocking portion 52 bent forwardly from two opposite lateral sides of the keeping portion 51, a pressing portion 53 disposed on an end of the keeping portion 51 and having a fork shape, and a soldering portion 54 downwardly extending from the elastic portion 50. The contacts 5 are received in the contact receiving holes 13 of the base 1 and the passageways 22 of the loading member 2, the keeping portion 51 of the contact 5 is received in the contact receiving hole 13, the pressing portion 53 is received in the passageway 22 of the loading member 2, the blocking portion 52 is located between a bottom surface of the passageway 22 of the loading member 2 and a top surface of the contact receiving holes 13 of the base 1.

The lid 4 has a clasp 40 on each of two opposite sides of an end thereof, the clasp 40 latches with two ends of the shaft 16 to pivotally assemble the lid 4 to the base 1. A locking member 42 is pivotally connected to another opposite end of the lid 4 by a connecting pole 43 and can lock the lid 4 on the base 1 to be a closed status. A heat sink 41 is assembled on the lid 4, a bracket 44 is retained under the lid 4 to support the heat sink 41, the heat sink 41 and the bracket 44 can rotate following with the lid 4.

Figure 3:
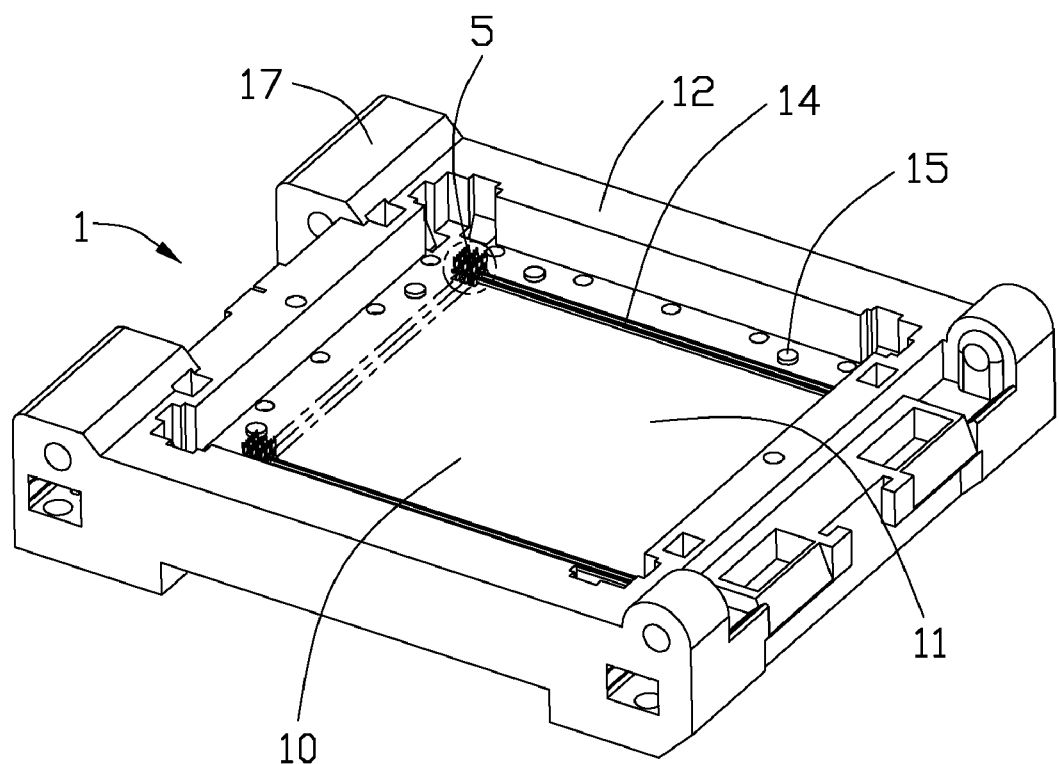
FIG. 3 is a perspective view of a base of the burn-in socket assembly in accordance with present invention.
Figure 4:
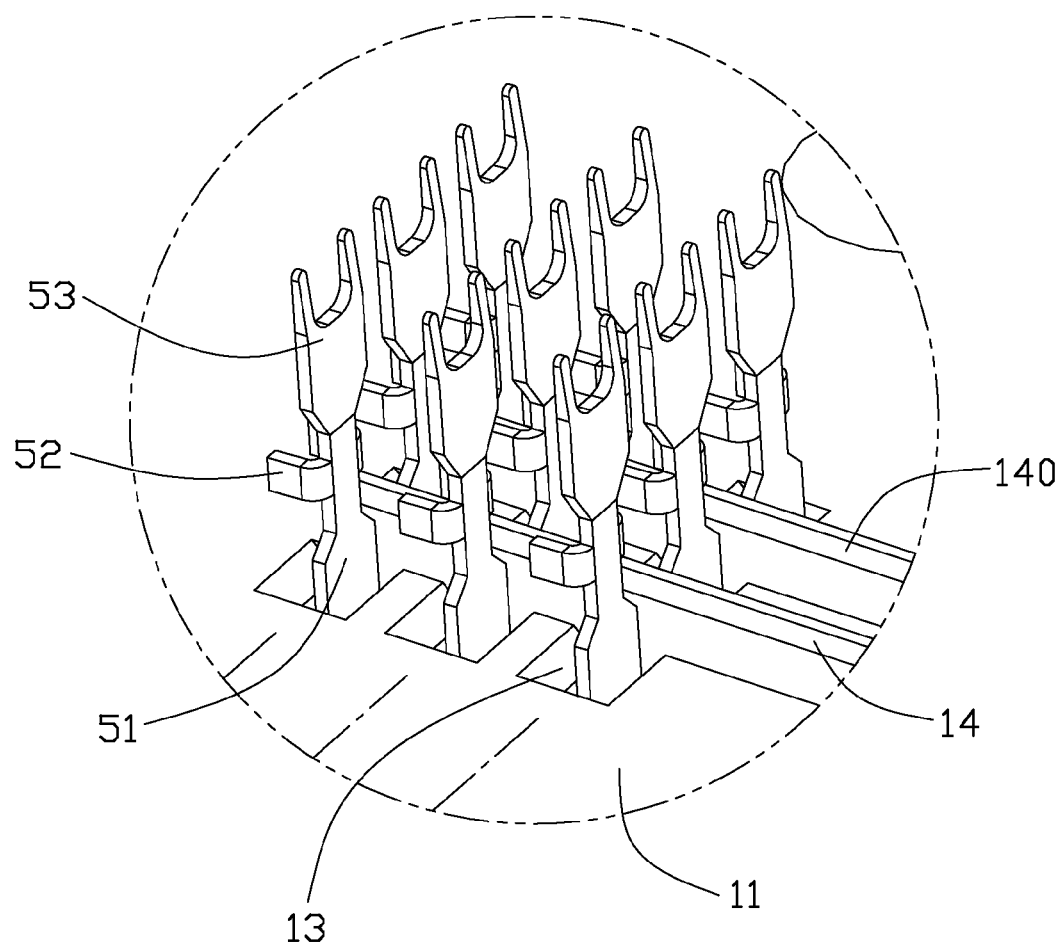
FIG. 4 is an enlarged view of the circled part in FIG. 3.
Figure 5:
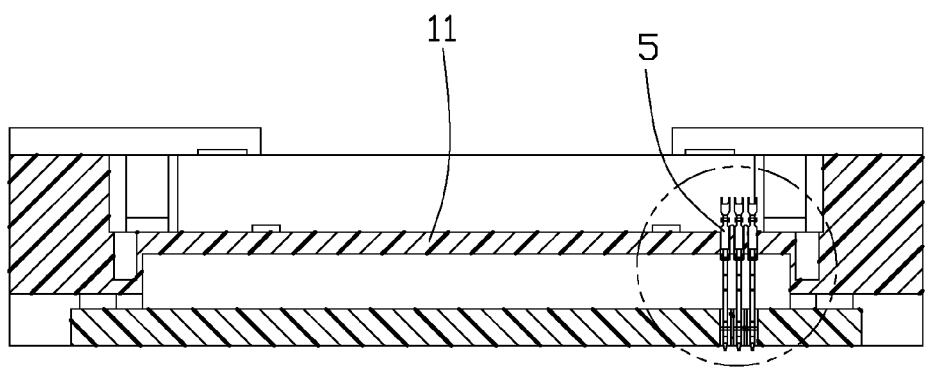
FIG. 5 is a side view of the base of the burn-in socket assembly in accordance with present invention.

Referring to FIG. 3 and FIG. 5, when assembling the burn-in socket assembly 100, the contacts 5 are disposed within the base 1, the loading member 2 is mounted on the cavity 10 of the base 1, the bracket 44 and the heat sink 41 are assembled on or below the lid 4, finally, assemble the lid 4 to the base 1 by the shaft 16, and the assembly is finished.

Figure 7:
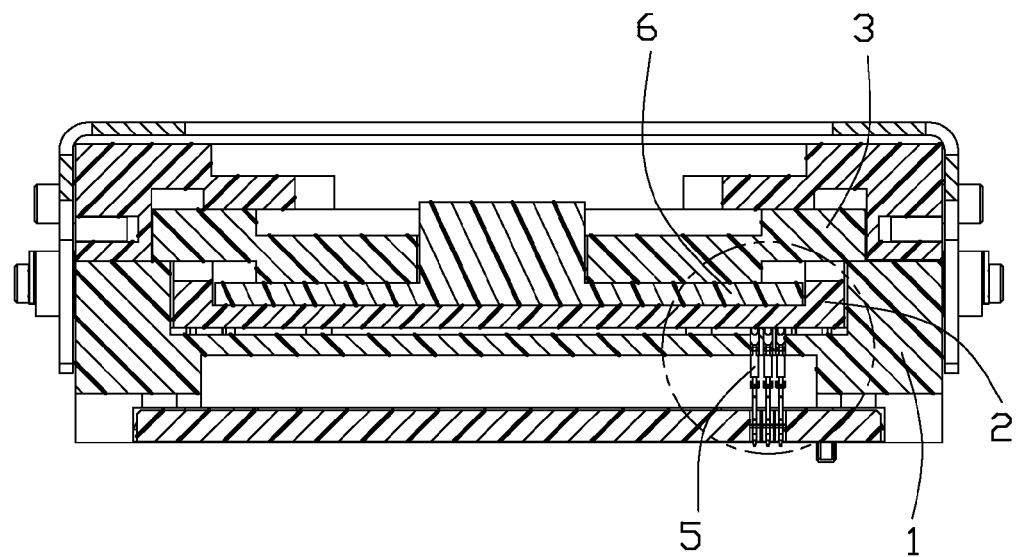
FIG. 7 is a section view of a part of the burn-in socket assembly and an integrated circuit package.
Figure 8:
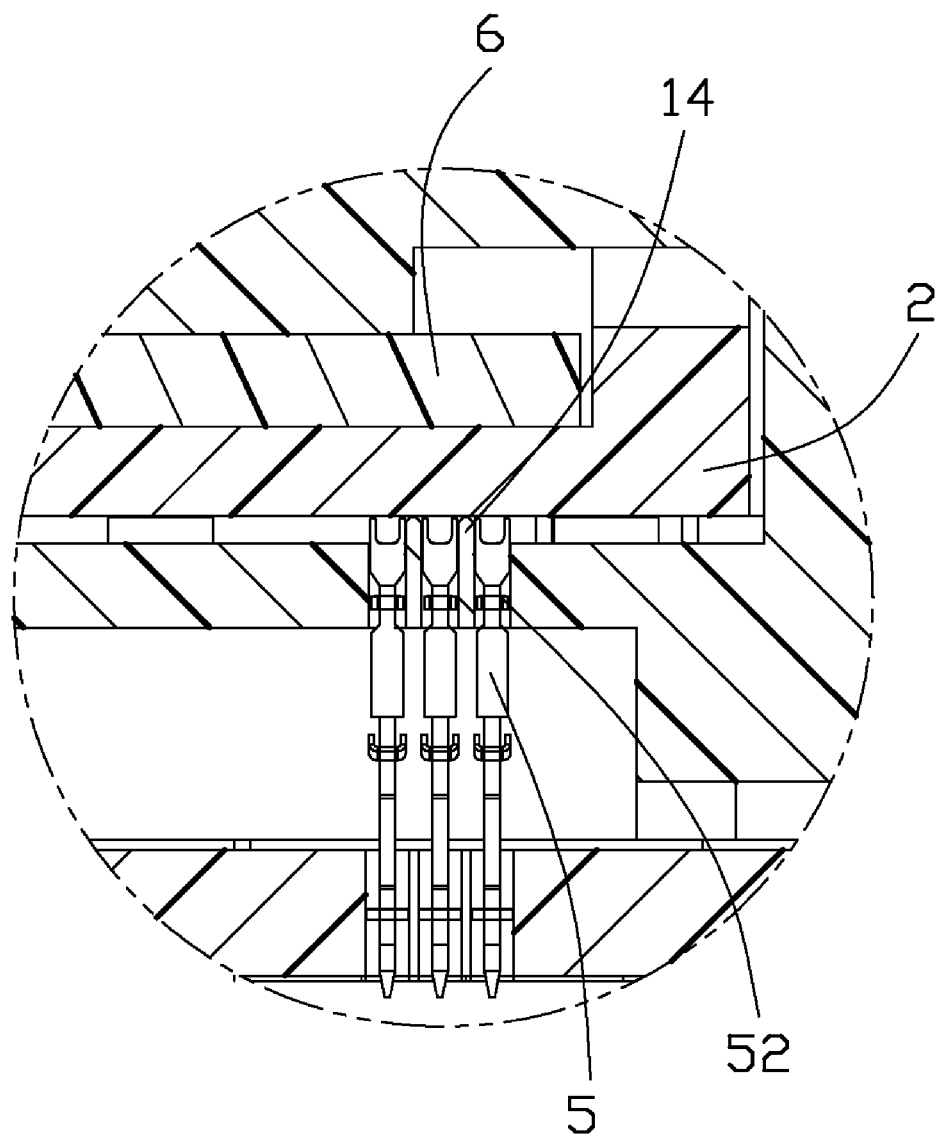
FIG. 8 is an enlarged view of the circled part in FIG. 7.

Referring to FIGS. 7-8, in using, the IC package 6 is put on the loading member 2 after opening the lid 4, then the IC package 6 and the loading member 2 are downwardly pressed by the lid 4 locking with the base 1. When testing an IC package with a slim dimension, there is no over-press situation on the base 1, the pressing portion 53 of the contact 5 reliably contacts with the IC package 6. But when the IC package 6 to be tested has a bulky size, the loading member 2 may has an excessive downward travel caused by the lid 4, that means the loading member 2 is over pressed. Then, the protruding strips 14 and the bumps 15 on the bottom wall 11 of the base 1 can cooperatively support the loading member 2 so as to prevent the loading member 2 from being over-pressed, which may cause a center part thereof bowed down. The chamfer 140 of the protruding strip 14 can guide a bottom surface of the blocking portion 52 of the contact 5 to downwardly move, the chamfer 140 make the movement of the contact 5 slowly and placidly and avoid the contact 5 to interfere with the protruding strip 14, which may result the contact 5 can not return back to its original position. The protruding strip 14 can protect the loading member 2 and ensure the pressing portion 53 of the contact 5 contacts with the IC package 6.

However, the disclosure is illustrative only, changes may be made in detail, especially in matter of shape, size, and arrangement of parts within the principles of the invention.

What is claimed is:

1. A burn-in socket assembly, adapted for electrically connecting an integrated circuit (IC) package to a printed circuit board, comprising:
    a plurality of contacts, the contact having an elastic portion, a keeping portion upwardly extending from the elastic portion, a pair of blocking portion bent forwardly from two opposite lateral sides of the keeping portion, a pressing portion disposed on a top end of the keeping portion with a fork configuration, and a soldering portion downwardly extending from the elastic portion;
    a base, the base having a bottom wall which defines a plurality of contact receiving holes receiving the contacts; and
    a loading member received within the base for loading the IC package; wherein
    the bottom wall of the base is formed with a plurality of protruding strips between two rows of the contact receiving holes to support the loading member, wherein the protruding strip defines a chamfer at a top end thereof.

2. The burn-in socket assembly as claimed in claim 1, wherein the protruding strip defines a chamfer at a top end thereof.

3. The burn-in socket assembly as claimed in claim 2, wherein the base has a plurality of sidewalls upwardly extending from a peripheral of the bottom wall and a cavity surrounded by the bottom wall and the sidewalls.

4. The burn-in socket assembly as claimed in claim 3, wherein the bottom wall is formed with a plurality of bumps on four corners thereof.

5. The burn-in socket assembly as claimed in claim 2, wherein the loading member has a bottom plate and a plurality of rims upwardly protruding from a peripheral of the bottom plate, the bottom plate defines a plurality of passageways to receive the contacts.

6. The burn-in socket assembly as claimed in claim 1, wherein the keeping portion is received in the contact receiving hole, the pressing portion is received in the passageway of the loading member, the blocking portion is located between a bottom surface of the passageway of the loading member and a top surface of the contact receiving hole of the base.

7. The burn-in socket assembly as claimed in claim 1, wherein the chamfer of the protruding strip guides the blocking portion during a downward movement of the contact.

8. The burn-in socket assembly as claimed in claim 1, further comprising a lid and a heat sink, the lid is pivotally assembled to the base, and the heat sink is assembled on the lid and rotates together with the lid.

9. A burn-in socket assembly, comprising:
    a base, the base having a bottom wall, a plurality of sidewalls upwardly extending from a peripheral of the bottom wall and a cavity surrounded by the bottom wall and the sidewalls, a plurality of contact receiving holes defined on the bottom wall to receive the contacts, the bottom wall further formed with a plurality of protruding strips on a top surface thereof and disposed between two adjacent rows of the contact receiving holes;
    a loading member assembled within the base for loading an integrated circuit package and defining a plurality of passageways corresponding to the contact receiving holes of the base; and
    a plurality of contacts received in the contact receiving holes of the base and the passageways of the loading member, wherein
    the bottom wall of the base has a plurality of bumps on four corners to support the loading member.

10. The burn-in socket assembly as claimed in claim 9, wherein the protruding strip supports the loading member.

11. The burn-in socket assembly as claimed in claim 9, wherein the contact has an elastic portion, a keeping portion upwardly extending from the elastic portion, a pair of blocking portion bent forwardly from two opposite lateral sides of the keeping portion, a pressing portion disposed on a top end of the keeping portion with a fork configuration, and a soldering portion downwardly extending from the elastic portion.

12. The burn-in socket assembly as claimed in claim 11, wherein the keeping portion is received in the contact receiving hole, the pressing portion is received in the passageway of the loading member, the blocking portion is located between a bottom surface of the passageway of the loading member and a top surface of the contact receiving hole of the base.

13. The burn-in socket assembly as claimed in claim 10, wherein the protruding strip has a chamfer at a top end thereof to guide the blocking portion.

14. A burn-in socket assembly for electrically connecting an integrated circuit (IC) package to a printed circuit board, comprising:
    a base, the base having a bottom wall defining a plurality of contact receiving holes;
    a plurality of contacts received in the corresponding contact receiving holes with contacting sections extending upward beyond a top face of the bottom wall; and
    a loading member received assembled to the base for loading the IC package and including a bottom plate with therein a plurality of passageways in alignment with the corresponding contact receiving holes, respectively, and with a bottom face spaced from the top face of the bottom wall of the base in a vertical direction; wherein a plurality of protruding strips unitarily extend either upwardly from the top face of the bottom wall and between every adjacent two rows of the contact receiving holes for upwardly abutting against the bottom face of the bottom plate, or downwrdly from the bottom face of the bottom plate and between every adjacent two rows of the passageways for downwardly abutting against the top face of the bottom wall; wherein each of said protruding strips extends horizontally along a row direction, each of said protruding strips extends horizontally with a full dimension of the bottom plate in the row direction when said protruding strips are unitarily formed on the bottom plate, or with a full dimension of the bottom wall in the row direction when said protruding strips are unitarily formed on the bottom wall.

15. The burn-in socket assembly as claimed in claim 14, wherein each of said protruding strips defines two opposite chamfered structures on two sides at a tip end thereof.

16. The burn-in socket assembly as claimed in claim 14, wherein said protruding strips are located at least around a center region of the top face when the protruding strips are unitarily formed on the bottom wall, or around a center region of the bottom face when the protruding strips are unitarily formed on the bottom plate.

17. The burn-in socket assembly as claimed in claim 15, wherein the contact has an elastic portion, a keeping portion upwardly extending from the elastic portion, a pair of blocking portion bent forwardly from two opposite lateral sides of the keeping portion, a pressing portion disposed on a top end of the keeping portion with a fork configuration, and a soldering portion downwardly extending from the elastic portion.

18. The burn-in socket assembly as claimed in claim 17, wherein the chamfered structures of the protruding strip guide the blocking portion.

\* \* \* \* \*